United States Patent
Schray

(10) Patent No.: US 11,565,941 B2
(45) Date of Patent: Jan. 31, 2023

(54) COMPOSITE WITH LITHIUM SILICATE AND METHOD WITH A QUENCHING STEP

(71) Applicant: Hagen Schray, Karlsbad-Langensteinbach (DE)

(72) Inventor: Hagen Schray, Karlsbad-Langensteinbach (DE)

(*) Notice: Subject to any disclaimer, the term of this patent is extended or adjusted under 35 U.S.C. 154(b) by 156 days.

(21) Appl. No.: 16/951,285

(22) Filed: Nov. 18, 2020

(65) Prior Publication Data

US 2021/0292174 A1    Sep. 23, 2021

(30) Foreign Application Priority Data

Mar. 17, 2020    (DE) ...................... 10 2020 001 776.2

(51) Int. Cl.
| | | |
|---|---|---|
| *C30B 29/34* | (2006.01) | |
| *C01B 33/12* | (2006.01) | |
| *C30B 33/04* | (2006.01) | |

(52) U.S. Cl.
CPC ............ *C01B 33/126* (2013.01); *C30B 29/34* (2013.01); *C30B 33/04* (2013.01); *C01P 2006/42* (2013.01)

(58) Field of Classification Search
CPC ....... C30B 29/34; C30B 33/04; C01B 33/126; C01P 2006/42
See application file for complete search history.

(56) References Cited

U.S. PATENT DOCUMENTS

| | | |
|---|---|---|
| 5,872,069 A | 2/1999 | Abe |
| 7,465,686 B2 | 12/2008 | Comte |
| 7,473,660 B2 | 1/2009 | Comte |
| 8,765,619 B2 | 7/2014 | Brunet et al. |
| 9,737,465 B2 | 8/2017 | Fecher et al. |
| 10,442,725 B2 | 10/2019 | Durschang et al. |
| 10,604,441 B2 | 3/2020 | Baker et al. |

(Continued)

FOREIGN PATENT DOCUMENTS

| | | |
|---|---|---|
| CN | 102315432 A | 1/2012 |
| CN | 107963815 A | 4/2018 |

(Continued)

OTHER PUBLICATIONS

Togashi et al., "electorchemical performance of composites of spinel tyep L1FeMnSiO nanocrystals and glassy phase synthesizied by quenching melts" Journal of Germanic Society of Japan vol. 123 (1) 2015 pp. 26-32.*

(Continued)

*Primary Examiner* — Robert M Kunemund
(74) *Attorney, Agent, or Firm* — Posz Law Group, PLC

(57) ABSTRACT

A composite has a solid-state structure, silicate, lithium ions, and at least one paramagnetic or diamagnetic element, which is different from lithium silicon, and oxygen. The solid-state structure has two areas in which the solid-state structure forms an identical crystal orientation. The areas are arranged at a distance of at least one millimeter from each other. A method has a quenching step in which a solid-state structure of a composite is produced, which differs from an ambient temperature solid-state structure. The composite produced by the method has silicate, lithium ions, and an element that is different from lithium, silicon, and oxygen. The method produces at least one gram of the phase pure composite in the quenching step.

35 Claims, 5 Drawing Sheets

(56) References Cited

U.S. PATENT DOCUMENTS

| | | | |
|---|---|---|---|
| 2007/0149379 | A1 | 6/2007 | Hsu et al. |
| 2013/0078519 | A1 | 3/2013 | Kojima et al. |
| 2019/0382304 | A1 | 12/2019 | Vollmann et al. |
| 2020/0172431 | A1 | 6/2020 | Click et al. |
| 2020/0354263 | A1 | 11/2020 | Beall et al. |

FOREIGN PATENT DOCUMENTS

| | | | |
|---|---|---|---|
| CN | 108069611 A | | 5/2018 |
| CN | 103337607 B | | 1/2019 |
| CN | 111517656 A | | 8/2020 |
| DE | 11 2011 102 161 T5 | | 5/2013 |
| EP | 1 569 289 A2 | | 8/2005 |
| EP | 2 925 276 B1 | | 11/2019 |
| FR | 2 102 426 A5 | | 4/1972 |
| JP | S59-141491 A | | 8/1984 |
| JP | S60-231499 A | | 11/1985 |
| JP | 2011-249324 A | | 12/2011 |
| JP | 2012-101949 A | | 5/2012 |
| JP | 2013-089298 A | | 5/2013 |
| JP | 2015-099790 A | | 5/2015 |
| JP | 2017-142967 A | | 8/2017 |
| RU | 2 615 697 C1 | | 4/2017 |
| WO | 2011/162348 A1 | | 12/2011 |
| WO | 2012/133566 A1 | | 10/2012 |
| WO | WO2011162348 | * | 8/2013 |
| WO | 2020202685 A1 | | 10/2020 |

OTHER PUBLICATIONS

Christoph Neef, "Inaugural-Dessertation", Heidelberg Oral Exam, Jun. 21, 2016.

Office Action dated Oct. 28, 2020 issued in corresponding DE patent application No. 10 2020 001 776.2 in English translation only.

Christoph Neef, "Inaugural-Dissertation", Jun. 21, 2016, pp. 154-158 (and English translation).

V.V.Politaev et al. Crystal structure, phase relations and electrochemical properties of monoclinic $Li_2MnSiO_4$ Science Direct, Journal of Solid State Chemistry 180, available online Jan. 13, 2007, pp. 1045-1050, Russia, Elsevier Inc. Russia.

Ammundsen et al., "Nanoscale Control of the Morphology of Lithium Manganate and Silica Composites Using Self-Organized Sol-Gel Media," Chem. Mater., vol. 9, No. 12, 1997, pp. 3236-3246.

Ferrari et al., "New materials for Li-ion batteries: synthesis and spectroscopic characterization of $Li2(FeMnCo)SiO4$ cathode materials," Scientific Reports, www.nature.com/scientificreports; Published Jun. 13, 2016, 6:27896, DOI: 10.1038/srep27896.

Gomma et al., "Electrical properties of some $Y2O3$ and/or $Fe2O3$-containing lithium silicate glasses and glass-ceramics," Journal of Materials Science: Material Electronics, Jan. 2008, 19: pp. 5-15.

Hsi et al., "Crystallization kinetics and magnetic properties of iron oxide contained $25Li2O$—$8MnO2$—$20CaO$—$2P2O5$—$45SiO2$ glasses," Journal of the European Ceramic Society 27 (2007), available online Feb. 9, 2007,pp. 3171-3176.

Nayak, M.T., "Magnetic and spectroscopic studies of an iron lithium calcium silicate glass and ceramic," Journal of Non-Crystalline Solids (2018), https://doi.org/10.1016/j.jnoncrysol.2017.12.050.

Yoshii et al., "Nambulite, a new lithium- and sodium-bearing manganese silicate from the Funakozawa mine, northeastern Japan," Mineralogical Journal 1972, vol. 7, No. 1, Oct. 1972, pp. 29-44.

Xun Zhengliang, Study on the cathode material of Polyhedron-type silicate lithium wonzitun pool, Doctoral dissertation, pp. 1-160, Xiamen University, Fujian Province, China, Nov. 1, 2007( English abstract attached).

Miyakoshi et al., "Single crystal structure determination of $Li2MSiO4$ (M=Fe,Mn) cathode materials", Abstract of the 54th Battery Symposium in Japan, Published Oct. 6, 2013, pp. 22, Osaka, Japan ( English abstract attached).

Kawaguchi et al., "Synthesis of $Li2MSiO4$ (M=Fe,Mn)-based cathode materials for lithium-ion batteries", The Japan Institute of Metals Kyushu Branch, The Iron and Steel Institute of Japan Kyushu Branch, The Japan Institute of Light Metals Kyushu Branch Joint Academic Lecture Summary Collection; 2011, pp. 50, Japan ( Machine translation attached).

Honma et al., "Fabrication of spynel type lithium iron silicate crystal by melt quenching method", The Ceramic Society of Japan Annual Meeting Lecture Proceedings, Mar. 19, 2012; pp. 347, Tokyo, Japan ( English abstract attached).

Togashi et al., "Relationship between the precipitation of spinel-type lithium iron silicate crystals and cooling condition in melting method", The Ceramic Society of Japan Annual Meeting Lecture Proceedings, Mar. 19, 2012; pp. 300, Tokyo, Japan (English abstract attached).

Matsuzawa et al., "Hydrothermal synthesis of $Li2MnSiO4$ mesocrystals and their application to a cathode material of lithium-ion Secondary Battery", The Ceramic Society of Japan Annual Meeting Lecture Proceedings, Mar. 19, 2012, pp. 229,Tokyo, Japan ( English abstract attached).

Nishimura et al., "Crystal structure of $Li2MSiO4$ (M=Fe,Mn)", Abstracts of the Annual Meeting of the 76th Electrochemical Society of Japan, Mar. 29, 2009, pp. 294, Japan (Machine translation attached).

Nishimura et al., "Crystal structure of $Li2FeSiO4$", Abstracts of the 49th Battery Symposium in Japan, Nov. 5, 2008, pp. 333, Japan ( English abstract attached).

Masahiro Setoguchi, "A study on phase relations and crystallization of $Li2MSiO4$(M=Mg, Zn, Co, Fe, Mn, Ca)", Report of the government industrial research institute, Jan. 1988, pp. 1-88, vol. 374, ISSN 0472-1438, Japan.

Office Action dated Nov. 18, 2022 in corresponding DE Patent Application No. 10 2020 001 776.2 (English translation only).

* cited by examiner

COMPOSITE WITH LITHIUM SILICATE AND METHOD WITH A QUENCHING STEP

CROSS REFERENCE TO RELATED APPLICATION

The present application claims the benefit of priority from German Patent Application No. DE 10 2020 001 776.2 filed on Mar. 17, 2020, the entire disclosure of which is incorporated herein by reference.

BACKGROUND

Technical Field

The invention relates to a composite having a solid-state structure and a method for producing a solid-state structure.

Description of Related Art

The dissertation of Christoph Neef entitled "Growth and Characterization of $LiMPO_4$ and $Li_2MSiO_4$ M=(Mn, Fe, Co) Micro and Macro Crystals" discloses a production of microscale and macroscale crystals of polyanionic $LiMPO_4$ and $Li_2MSiO_4$ M=(Mn, Fe, Co) compounds by microwave-assisted hydrothermal synthesis and the optical floating zone technique. The produced materials were characterized structurally by single crystal or powder X-ray diffractometry, as well as metallurgically, chemically, and with regard to their morphology by microscopy and X-ray spectroscopy and were furthermore studied through electrochemical cycling, impedance spectroscopy, magnetometry, and muon spin rotation and relaxation measurements. A significant influence of the particle morphology on the electrochemical properties and the usability as lithium-ion battery material was determined in $LiCoPO_4$ produced via additive assisted hydrothermal synthesis. Two polymorphic $LiCoPO_4$ modifications doped with Zn and Fe and the effects of the transition metal substitution on the magnetic and electrochemical properties were further studied. The spin dynamics of the tetrahedral modification was studied with the aid of nuclear magnetic resonance and µSR. Magnetic fluctuations were thereby observed up to high temperatures. Macroscopic single crystals of the compounds $LiMn_{1-x}Fe_xPO_4$ (x=0, 0.1, 0.2, 0.3, 0.5, 1) and $Li_2FeSiO_4$ were produced in the floating-zone technique at elevated pressure and their exact growing parameters were determined. The studies of the magnetic properties and conductivity of $LiMn_{1-x}Fe_xPO_4$ show a significant doping dependency of the magnetic ground state and the magnetic anisotropy as well as the anisotropic high temperature mobility of the lithium ions. The single crystal structure of the produced $Li_2FeSiO_4$ modification was determined and its magnetic properties were studied for the first time.

SUMMARY

The object of the invention consists especially in making available a composite with improved material properties, which leads especially to an improved property with regard to measurability. The object is attained according to the invention by means of the claimed features, while advantageous embodiments and further developments of the invention can be inferred from the claims.

The invention originates from a composite having a solid-state structure, silicate, lithium ions, and at least one paramagnetic or diamagnetic element, which is different from lithium, silicon, and oxygen, wherein the solid-state structure has two areas in which the solid-state structure forms an identical crystal orientation.

It is proposed to arrange the areas at a distance of at least one millimeter from each other. The composite can consequently have more advantageous material properties, and it is therefore more likely that the section between the two areas has also the same crystal orientation, so that a composite can be formed that is monocrystalline at least over one section of at least one millimeter in one direction of extension. The solid-state structure of the composite can thus be defined more accurately with a preferable single-crystal measuring method.

A "composite having a solid-state structure, silicate, lithium ions, and at least one paramagnetic or diamagnetic element" should be understood to mean that the composite has, first, a solid-state structure, second, silicate, third, lithium ions, and fourth, at least one paramagnetic or diamagnetic element. The composite must thus have all four features. The silicate, the lithium ions, and/or the element are preferably arranged within the solid-state structure. The silicate, the lithium ions, and/or the element preferably form the solid-state structure at least in part or to a great extent.

"The silicate, the lithium ions, and/or the element form the solid-state structure at least in part" should be understood to mean in particular that a portion of at least ten percent, and especially at least 20 percent, of the solid-state structure, is formed by the silicate, the lithium ions, and/or the element.

"The silicate, the lithium ions, and/or the element preferably form the solid-state structure to a great extent" should especially be understood to mean that a portion of at least 50 percent, especially at least up to 70 percent of the solid-state structure is comprised by the silicate, the lithium ions, and/or the element. The silicate, the lithium ions, and the element, respectively, preferably have separately or in combination a mass of at least 0.1 grams, especially at least one gram.

A "solid-state structure" should be understood to mean a structure which is held together under an ionic bond, wherein this is based on electrostatic attraction forces of the oppositely charged ions. The solid-state structure especially features several differently arranged crystal lattices.

The term "silicate" should be understood to mean especially a charged ionic solid-state compound consisting of oxygen and silicon elements in bonded form. The silicate is especially formed as nesosilicate, sorosilicate, cyclosilicate, inosilicate, phyllosilicate, or tectosilicate. The silicate preferably has a tetrahedral solid-state structure and/or $SiO_4$, wherein the silicate especially carries a quadruple negative charge. The silicate preferably has an $SiO_4$ tetrahedral solid-state structure, wherein the silicate especially carries a quadruple negative charge. A partial amount of the lithium ions can preferably be moved within the solid-state structure and/or into or out of the solid-state structure as a result of external electromagnetic fields.

A "diamagnetic element" should be understood to mean a material which has a magnetic susceptibility $\chi$ of less than 0 or a relative permeability of less than one in a pure material state. A "paramagnetic element" should be understood to mean a material which has a positive magnetic susceptibility or a magnetic permeability that is greater than one in a pure material state, wherein no persisting magnetic order can be created by means of this material. A "paramagnetic or diamagnetic element" should not be understood to mean a ferromagnetic element. An "element" should be understood to mean a raw chemical material that cannot be decomposed further by means of chemical methods or a pure substance that cannot be further chemically decomposed.

An "area" should be understood to mean a three-dimensional portion of the solid-state structure that forms a volume of no less than one cubic micrometer and maximum 0.001 cubic millimeters, wherein the minimum length of extension especially in all three spatial directions is one micrometer and the maximum length of extension especially in all three spatial directions is 0.1 millimeters. The volume preferably has no less than 100 cubic micrometers and/or maximum 1000 cubic micrometers.

An "identical crystal orientation" can be understood to mean that one of the two areas would be exclusively translationally displaced in such a way that the solid-state structure of this area would be congruent with the solid-state structure of the other area. It can also be alternatively understood that a main axis of the solid-state structure differs by a maximum of 5°, especially maximum of 1°, in one of the two areas from the especially identical main axis of the solid-state structure of the second area. Or again, it can be understood as an alternative that a main axis reflex of the one area cannot be differentiated in angle to angle from a further main axis reflex of the second area in a measurement by means of a commercially available Laue diffractometer. A "main axis reflex" should especially be understood to mean a reflection of, for example, X-ray radiation, that interferes at the solid-state structure, which depends on a main axis of the solid-state structure. A "main axis" should especially be understood to mean an axis that is parallel to the normal orientation of a lattice plain of the solid-state structure. The solid-state structure especially forms exactly three main axes.

A "distance" should be understood to mean the shortest possible connecting distance between the two centers of mass of the respective areas.

The element is preferably a transition metal ion. A "transition metal ion" should be understood to mean a charged subgroup element that has an incomplete d subshell. As an alternative or in addition, the "transition metal ion" is a zinc group element. As an alternative or in addition, the subgroup elements also include lanthanoids and actinoids. Because the element is a transition metal ion, the solid-state structure can have a particularly advantageously regular solid-state structure, which is especially suitable for single crystal measurements. The transition metal ion is particularly and advantageously a subgroup element of the seventh subgroup. The transition metal ion is particularly and preferably a manganese ion. A particularly advantageous solid-state structure can be produced because the transition metal ion is a manganese ion.

It is further proposed to form the solid-state structure at least in part and especially for the most part as a single crystal measuring no less than one cubic millimeter, wherein the areas are arranged within the single crystal. "The solid-state structure is formed at least in part as a single crystal" should be understood to mean that the solid-state structure is formed at least up to 10 percent, especially at least up to 20 percent, and advantageously at least up to 30 percent, as a single crystal. "The solid-state structure is formed at least for the most part as a single crystal" should be understood to mean that the solid-state structure is formed at least up to 50 percent, especially at least up to 80 percent and advantageously at least up to 90 percent, as a single crystal. A "single crystal" should be understood to mean a solid material whose atoms or molecules are arranged as a regularly repeating lattice structure also within the long-distance range. This also includes twin crystals and products that consist mainly of single crystals. A "twin crystal" should be understood to mean a crystalline material in which the adjoining crystal lattices are arranged mirror-symmetrical to each other. "The products consist mainly of single crystals" should be understood to mean that the products consist of at least 90 percent by weight of single crystals and especially consist of exactly one single crystal. Twin crystals and products consisting predominantly of single crystals are, however, preferably ruled out. As a result of the advantageous configuration, the composite has at least in parts a single crystal, wherein a very high material purity can be ensured in these sections, and the solid-state structure is particularly arranged regularly, whereby a particularly accurate determination of lattice constants of the solid-state structure can be achieved.

It is furthermore proposed that the composite has a body side surface, wherein the two areas are arranged directly on the body side surface. A "body side surface" should especially be understood to mean a surface of the composite that is visible from precisely one viewing direction. A "surface" can be understood to mean a boundary surface of a three-dimensional body that is primarily formed by the composite. A "side" can be understood to mean one or several surfaces that delimit a body and form a visible part of the surface of a body from one viewing direction. The composite has especially at least two and/or a maximum of six body side surfaces. The measuring surface of the composite is improved as a result of this advantageous configuration in that not only one area exhibits a higher crystallinity, but two areas exhibit a higher crystallinity. The measuring surface that the solid-state structure to be studied can have is thus increased. This embodiment of the composite is thereby particularly suitable for surface measurements for determining lattice constants of the solid-state structure.

It is additionally proposed to produce the composite in a production process that has one process step in which the solid-state structure configures a growth direction, wherein the areas are arranged perpendicular to the growth direction at a distance of at least one millimeter. A "production process" should be understood to mean a process having at least one process step. The production process preferably features at least two and especially at least four process steps. A process step preferably features an optical floating-zone technique.

An "optical floating-zone technique" should be understood to mean a floating-zone technique that is carried out by electromagnetic radiation. The "optical floating-zone technique" should be understood to mean a process for the purpose of forming a crystalline body by melting, subsequently cooling and crystallizing, a zone of a raw material, wherein either the melting zone or the raw material can be displaced, so that the entire raw material or a part thereof can be transferred into a crystalline body.

The production process especially features further previous process steps, especially at least two solid-state synthesis steps, in which an educt of the composite is produced. The one solid-state synthesis step especially features at least two and preferably exactly three sintering steps. One process step, which lies between the preceding solid-state synthesis steps and the optical floating-zone technique, includes especially at least one substrate ingot production step.

A "growth direction" should be understood to mean a direction in which the solid-state structure grows in a process step, wherein the process step especially produces the solid-state structure. The optical floating-zone technique, which defines the growth direction, is particularly preferred. With the aid of the advantageous embodiment, it can be assumed that it is highly possible that a macroscopic single crystal will be produced that will extend especially perpendicular to the growth direction.

The composite advantageously has a second element, which is different from lithium, silicon, oxygen, and the paramagnetic or diamagnetic element. The second element is preferably a transition metal ion. The transition metal ion is preferably a subgroup element of the eighth subgroup. The transition metal ion is particularly preferably an iron ion. The composite is easier to produce as a result of this advantageous embodiment. The composite can especially feature further elements, which are different from lithium, silicon, oxygen, the paramagnetic or diamagnetic element, and the second element. The second element and/or especially further elements can be preferably arranged within the solid-state structure, and/or the second element and the further elements especially form the solid-state structure at least in part and especially to a great extent.

In another embodiment of the invention, it is proposed that the composite has a chemical composition, which is defined at least via a molar ratio, wherein the molar ratio is a quotient of an amount of substance of the paramagnetic or diamagnetic element and an amount of substance of the silicate. In this case, the molar ratio is less than 0.4, preferably less than 0.3, and especially greater than 0.1 A "molar ratio" should be understood to mean a quotient of the amount of substance. A "quotient" should be understood to mean a mathematical expression which has a dividend and a divisor. "The molar ratio is a quotient of the amount of substance of the paramagnetic or diamagnetic element and an amount of substance of the silicate" should be understood to mean that the dividend is the amount of substance of the paramagnetic or diamagnetic element and the divisor is the amount of substance of the silicate in the quotient. A composite having improved properties with reference to crystallinity and thus particularly advantageous sections with a high material purity and high homogeneity within the composite is made available by means of this especially advantageous embodiment of the invention.

It is explicitly possible to combine all the previously mentioned embodiments with each other.

In another aspect of the invention, the invention is based on a method having a quenching step in which a solid-state structure of a composite is produced, which differs from an ambient temperature solid-state structure, wherein the composite has silicate, lithium ions, and an element that is different from lithium, silicon, and oxygen.

It is proposed to produce at least one gram of the phase pure composite in the quenching step. The material utilization efficiency in the quenching step is increased as a result of this process since especially the proportion of dead material is reduced. Composites, which can be analyzed, for example, with neutron scattering experiments, can additionally be advantageously produced by this process since the mass is sufficiently high. In this way, the atom positions can especially be measured directly, whereby a still more accurate solid-state structure determination can be achieved.

A "quenching step" should be understood to mean a time limited, preferably less than one minute, fast, cooling procedure, during which a solid-state structure of a composite, which differs from an ambient temperature solid-state structure, is produced.

"One solid-state structure of a composite, which differs from an ambient temperature solid-state structure, is produced" should be understood to mean especially that at least 10 percent by volume or weight, and preferably at least 50 percent by volume or weight, of the solid-state structure is different from the ambient temperature solid-state structure.

An "ambient temperature solid-state structure" should be understood to mean a solid-state structure that is energetically lowest at ambient temperature. "Ambient temperature" should be understood to mean a temperature between 273 Kelvin and 303 Kelvin.

"At least one gram of phase pure composite is produced" should be understood to mean that the composite, first, weighs at least one gram, and second, is available in phase pure form.

"Phase pure" should be understood to mean that the purity of the composite is at least 95 percent by weight and especially at least 99 percent by weight, especially with reference to foreign phases, and that the solid-state structure within the composite is identical, at least 95 percent by volume and especially at least 99 percent by volume. It can alternatively also be understood that no further phase can be determined with a measurement by means of a commercially available XRD measuring device.

It is furthermore proposed to produce the solid-state structure directly below a melting temperature of the composite. A "melting temperature" should be understood to mean a temperature at which the liquid and solid phase of a material are just in equilibrium, wherein a crystal lattice of the solid-state structure starts to become liquid. "The solid-state structure is produced directly below a melting temperature of the composite" should be especially understood to mean that, for example, starting from a liquid phase in a cooling procedure, the solid-state structure is formed directly without a solid-state structure transformation. A solid state structure that could improve, for example, ion mobility, can be produced by means of the advantageous embodiment.

It is additionally proposed to use a transition metal ion as element. A particularly advantageous regular solid-state structure, which is particularly suited for single crystal measurements, can be produced because a transition metal ion is used for the element. An element of the eighth subgroup is preferably used for the transition metal ion. An iron ion is particularly preferably used for the transition metal ion. An especially advantageous homogeneous solid-state structure is produced because an iron ion is used for the transition metal ion. A Pmnb solid-state structure is particularly preferably formed in the quenching step.

The quenching step is advantageously carried out with the aid of a liquid. A "liquid" should be understood to mean a substance in liquid physical state at room temperature. "The quenching step is carried out with the aid of a liquid" should be understood to mean that the liquid absorbs the thermal energy of the composite and that the liquid is thus heated, so that an accelerated cooling process can be carried out in contrast to a cooling process without liquid. The composite is preferably cooled by means of the liquid that is in direct contact. The quenching step can be earned out particularly quickly as a result of this advantageous embodiment, so that a high cooling rate is made possible. The use of a liquid additionally makes possible a high heat transfer from the composite to the liquid; this is based on the high heat capacity of the liquid. Water and/or oil are especially used as liquid.

It is further proposed to reduce or prevent oxidation of the composite during the quenching step by means of an oxygen-absorbing product. "Oxidation" should be understood to mean an electron emission from an element and/or a chemical bond. An "oxygen-absorbing product" should be understood to mean a composite or a device which absorbs oxygen in the quenching step and thereby creates an oxygen-reduced environment particularly within the close range of the product, for example, ten centimeters. "To reduce or prevent oxidation of the composite" should be understood to mean that an inclusion of oxygen into the composite is lower than that without an oxygen-absorbing product. This difference is at least ten and especially at least 20 percent. As a result of this advantageous embodiment, the quenching step is particularly material effective, so that especially less waste material is produced in the quenching step.

In another embodiment of the invention, it is proposed to cool the composite by at least ten Kelvin per second in the quenching step. An especially pure solid-state structure can be produced thereby, while particularly solid-state structures can be produced which are formed just below the melting temperature.

It is additionally proposed that the method has a heating process, which takes place under an oxygen-free atmosphere, wherein the final temperature of the heating process is the starting temperature of the quenching step, whereupon the solid-state structure is homogeneous after the heating process. A "heating process" should be understood to mean a process which increases the temperature. An "oxygen-free atmosphere" should be understood to mean a gas composition that has a maximum of one percent, especially a maximum of 0.01 percent of oxygen. "Homogeneous" should be understood to mean that the solid-state structure is the same up to at least 95 and especially up to at least 99 percent by weight and/or up to at least 95 and especially up to at least 99 percent by volume.

In another embodiment of the invention, it is proposed to produce a composite by means of the method featuring the quenching step.

It is explicitly possible to combine all previously mentioned embodiments with each other.

To interpret this patent application, it is also possible to use the prior art dissertation to interpret terms.

Batteries, secondary cells, optical devices, jewelry, sample crystals, surface coatings of devices, and/or electronic elements such as those disclosed, for example, in patent publication DE 34 33 150 C2 of Ludwig Rausch, can have a composite according to this invention, or these parts can be especially produced by means of a method according to this invention. Other intended purposes are however not ruled out herewith. It is especially conceivable that a product, which is suitable for the above-mentioned intended purposes, can be produced from the composite in further method steps. It is especially conceivable that the method has other production steps that are not claimed in this patent application, which lead to a product that can meet the above-mentioned intended purposes.

BRIEF DESCRIPTION OF THE DRAWINGS

Further advantages are obtained from the following description of the figures. Exemplary embodiments of the invention are represented in the drawings. The drawings, the description, and the claims include numerous combined features. The person skilled in the art would also practically consider the features separately and would combine these into further useful combinations.

DETAILED DESCRIPTION

The composite is produced by means of a production process. The production process has two solid-state synthesis steps. A first solid synthesis produces $Li_2SiO_3$. The first solid-state synthesis step utilizes $Li_2CO_3$ and $SiO_2$ as educts in a ratio of 1.01:1. The first solid-state synthesis step has a grinding step which is carried out by means of an agate ball mill with 5 mm balls for eight hours in acetone at 300 rpm, wherein the first solid-state synthesis step has a subsequent drying step which dries the educts in ambient air at 60° C. The first solid-state synthesis step has a first synthesis step that follows the drying step, which is carried out in a tube furnace at 700° C. for six hours under argon atmosphere at 100 mbar and with a gas flow of 150 sccm (standard cubic centimeters per minute). The tube furnace uses a heating rate and cooling rate of 150 K/h. It serves especially for discharging exhaust reaction products, especially $CO_2$. The first solid-state synthesis step has a second sintering step, which sinters the crushed raw material of the first sintering step at 750° C. for six hours in the air.

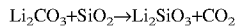

A second solid-state synthesis step has a mixing step which mixes the previously sintered $Li_2SiO_3$ with Fe, $Fe_3CO_4$ and MnO in a ratio of 1:0.25x:0.25x:1−x, wherein an x value must be less than 1. The second solid-state synthesis step has three sintering steps which follow the mixing step. The second solid-state synthesis step has a manual one-hour crushing step between each sintering step. Each of the three sintering steps has a one-hour 300° C. phase which is carried out at 100 mbar negative pressure and an argon gas flow of 150 sccm. The first sintering step utilizes a temperature of 800° C. The second and third sintering step utilize a temperature of 900° C. The heating rate and cooling rate are each 150 K/h. The sintering times are respectively twelve hours. The $Li_2SiO_3$ enters into a chemical reaction with the Fe, $Fe_3O_4$ and MnO in these sintering steps.

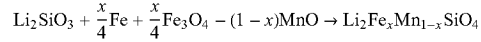

The mixing step can take place alternatively with $Fe_2O_3$ instead of $Fe_3O_4$.

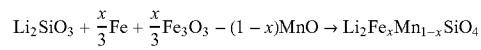

The production process has a substrate ingot production step, which is subsequent to the two solid-state synthesis steps. The production process has an optical floating-zone technique, which is subsequent to the substrate ingot production step. The optical floating-zone technique is carried out under an argon atmosphere. The optical floating-zone technique is carried out by means of a device having two pulling drives, which are operated at a pulling speed between 2.5 mm/h and 10 mm/h. The floating-zone technique has $Fe_3O_4$ blended powder mixtures.

Figure 1:
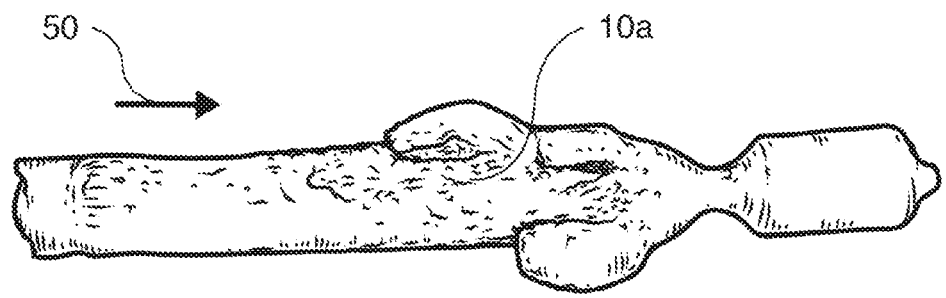
FIG. 1 is a perspective view that shows a composite having lithium ions, manganese ions, iron ions, and silicate.
Figure 2:
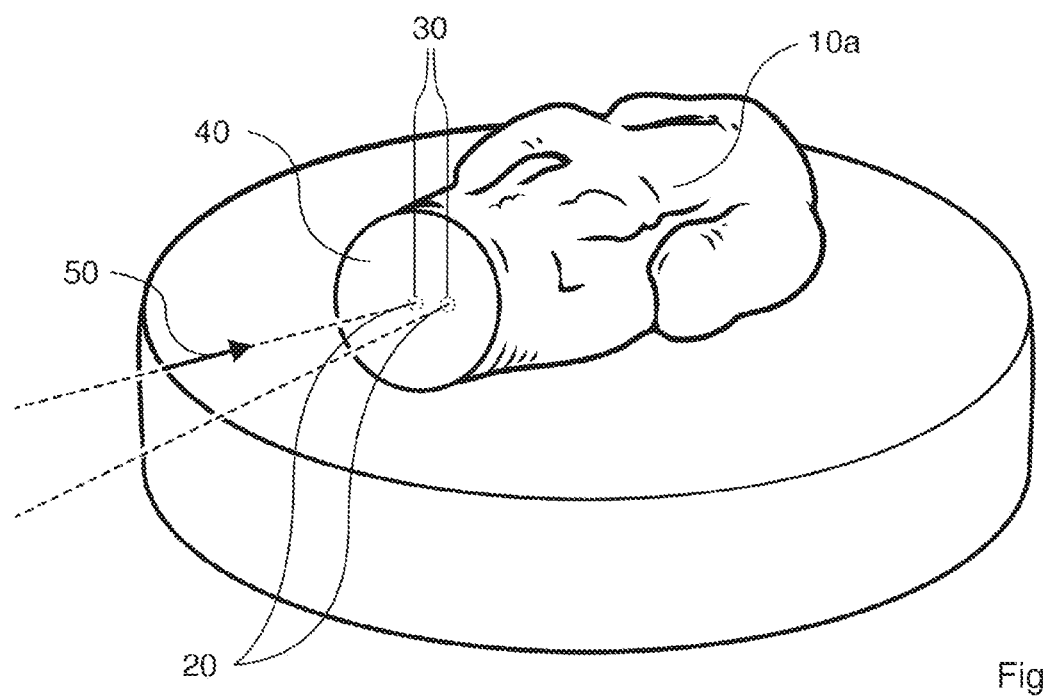
FIG. 2 is a perspective view that shows the composite for preparing a Laue diffractometer measurement.

A composite shown in FIGS. 1 and 2 has a solid-state structure 10a, silicate, lithium ions, and at least one manganese ion, wherein the solid-state structure 10a has two areas 20 in which the solid-state structure 10a forms the same crystal orientation, while the areas 20 are arranged at a distance 30 of at least one millimeter from each other. The silicate, the lithium ions, and the manganese ion are arranged within the solid-state structure 10a, and/or the silicate, the lithium ions, and the manganese ion form at least for the most part the solid-state structure 10a. The areas 20 form a volume of no less than 1 cubic micrometer.

The solid-state structure 10a could be formed at least in part as a single crystal measuring no less than one cubic millimeter, wherein the areas 20 can be arranged within the single crystal. The composite has a body side surface 40, wherein the two areas 20 are arranged directly on the body side surface 40.

The production process having the optical floating-zone technique, in which the solid-state structure 10a forms a growth direction 50, while the areas 20 are arranged at a distance 30 of at least one millimeter perpendicular to the growth direction 50. The composite has a chemical composition which is defined at least via a molar ratio, wherein the latter forms a quotient of an amount of substance of the paramagnetic or diamagnetic element and an amount of substance of the silicate, while the molar ratio is between 0.24 and 0.27. The composite is formed at least in part as a $Li_2Fe_{0.75\pm0.02}Mn_{0.25\pm0.02}SiO_4$ single crystal.

Figure 3:
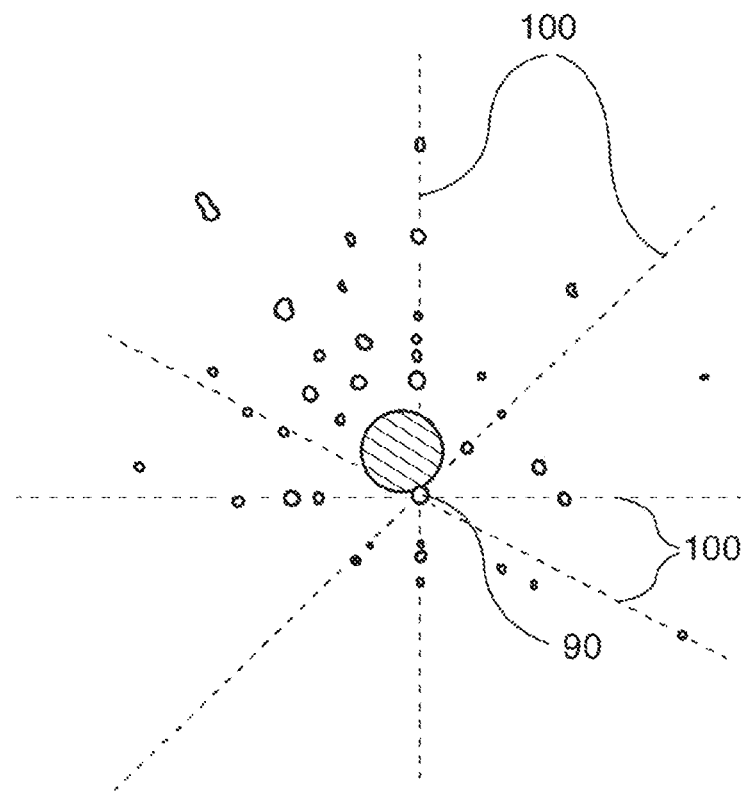
FIG. 3 is a Laue diffractometry image of an area of the composite.
Figure 4:
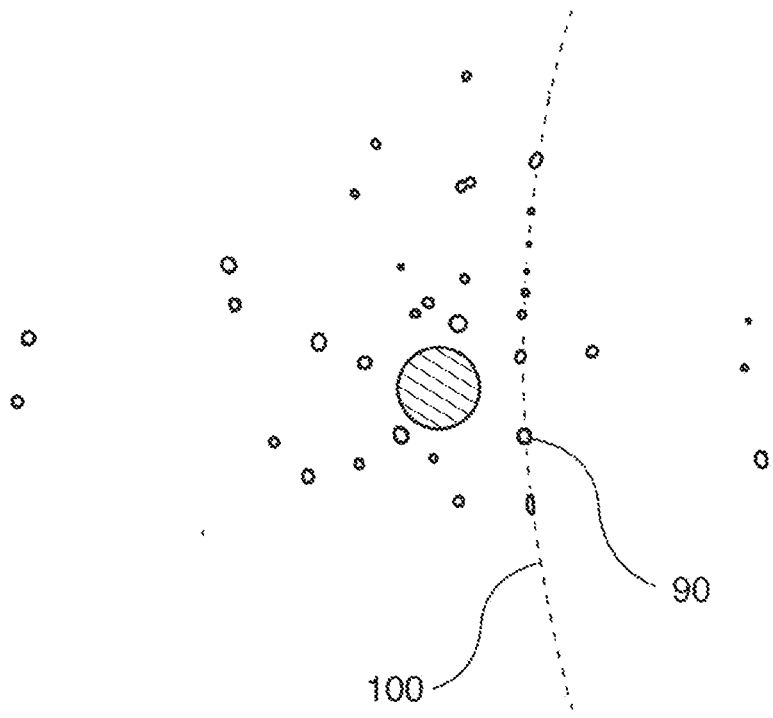
FIG. 4 is a second Laue diffractometry image of a second area of the composite.

The two areas 20 respectively create a Laue diffractometry image, which is shown in FIGS. 3 and 4. In the Laue image in FIG. 3 can be seen a main axis reflex 90 directly to the right underneath the protective device for the Photonic Science Laue CCD (charge-coupled device). The Laue diffractometry measurement direction corresponds thereby to the growth direction 50. Three to four weakly visible lines 100 intersect at this point. The composite is measured rotated by 10° in comparison to the Laue image of FIGS. 3 to 4. This rotation, as is also shown in FIG. 2, causes a change in the measuring position. This distance 30 between the measuring positions is greater than one millimeter. In FIG. 4, the main axis reflex 90 has shifted toward the right of the center point. The line 100, which is vertical in FIG. 3, has a curved trajectory in FIG. 4. The two to three other lines 100 are no longer visible.

Figure 5:
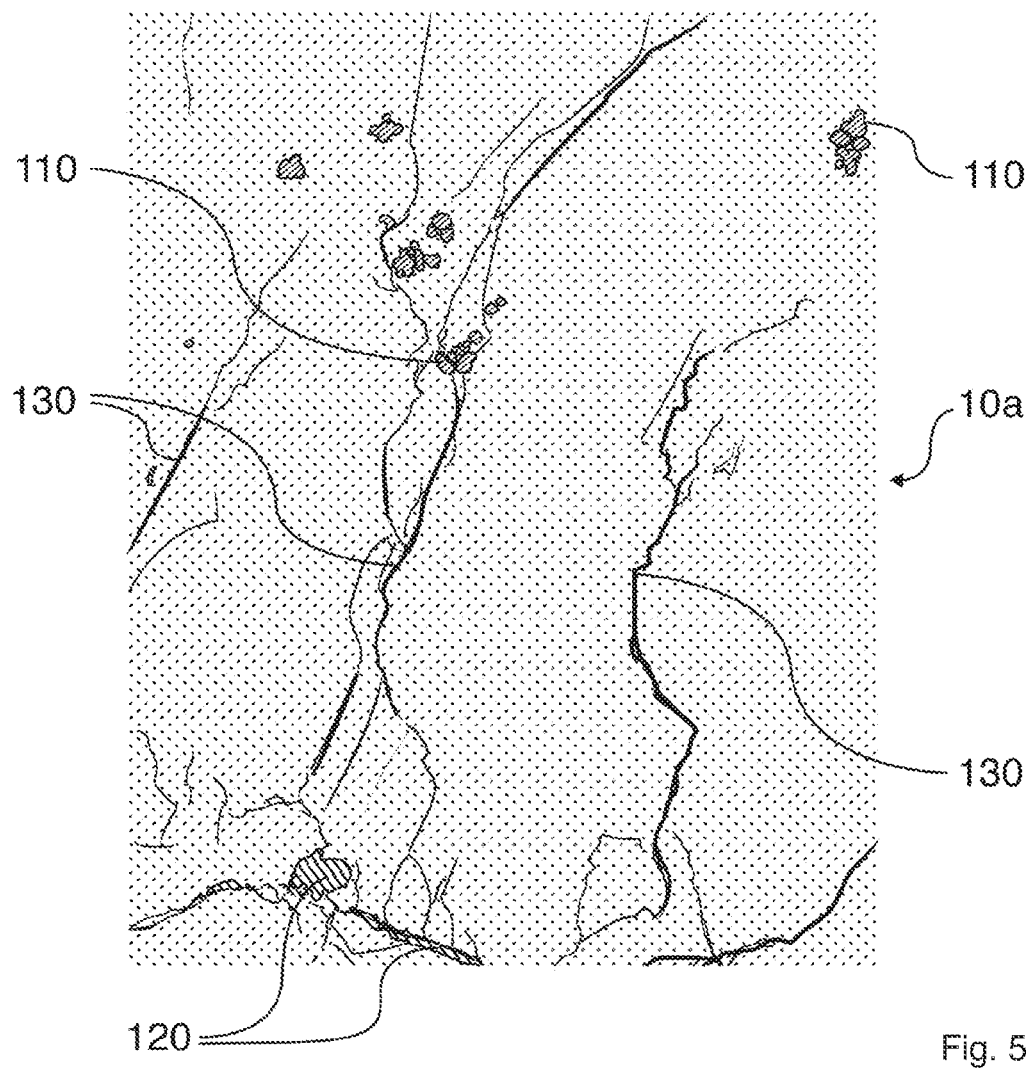
FIG. 5 is an electron microscope SEM micrograph of the composite.

FIG. 5 shows a one-millimeter size electron microscopic SEM micrograph (scanning electron microscopy image) of the composite. The composite forms at least up to 90 percent by volume, preferably up to 98 percent by volume, of a solid-state structure 10a, which is formed as a $Li_2Fe_{0.75\pm0.02}Mn_{0.25\pm0.02}SiO_4$ crystal. The composite has at least one foreign phase 110. The foreign phase 110 is made from ferrous oxide, wherein the composite forms a maximum of ten percent by volume, preferably less than two percent by volume of this foreign phase. A further foreign phase 120 is made from $SiO_2$, wherein the composite forms up to a maximum of five percent by volume, preferably less than one percent by volume of this foreign phase 120. The solid-state structure 10a has cracks 130.

A method has a first solid-state synthesis step which is identical to the first solid-state synthesis step mentioned in the production process. The method has a second solid-state synthesis step that follows the first solid-state synthesis step, which is identical to the alternative mixing step mentioned in the production process. In contrast to the production process, the second solid-state synthesis step has the x value 1. The second solid-state synthesis step has a first sintering step, which is carried out at 800° C. for twelve hours.

Figure 6:
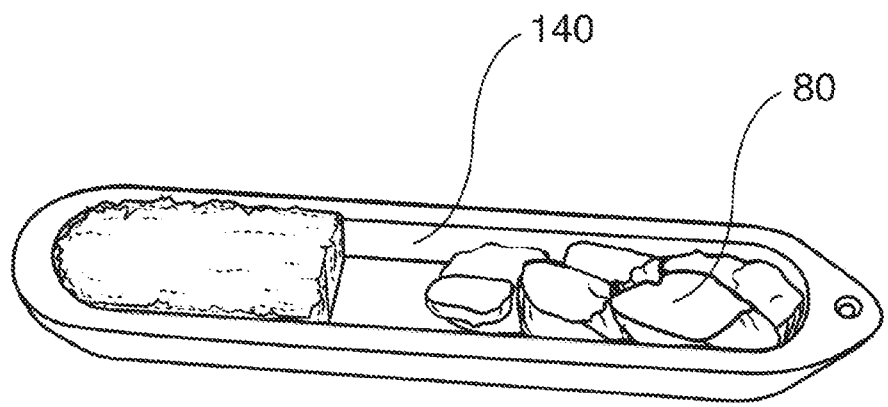
FIG. 6 is a perspective view that shows a composite having lithium ions, iron ions, and silicate before a method.

FIG. 6 shows a ceramic ship 140, a composite having lithium ions, iron ions, and silicate before a method as well as an oxygen-absorbing product 80 which is made from sacrificial iron. The composite is to be placed at the same as compactly as possible to keep a ratio between surface and volume of the composite as small as possible.

The method features a quenching step with which a solid-state structure 10b of a composite 60 is produced, which differs from a room temperature solid-state structure, wherein the composite 60 has silicate, lithium ions and an element that is different from lithium, silicon, and oxygen, wherein at least one gram of phase pure composite 60 is produced in the quenching step. The quenching step is carried out with the aid of a liquid 70. Oxidation of the composite 60 is reduced or prevented during the quenching step as a result of an oxygen-absorbing product 80, which is especially made from sacrificial iron.

The method features a heating process which takes place under an oxygen-free atmosphere, wherein 950° C. is maintained for over 16 hours. This temperature represents a starting temperature of a quenching step of the method. The quenching step is carried out within 15±2 seconds. The composite 60 is cooled by at least ten Kelvin per second in the quenching step.

Figure 7:
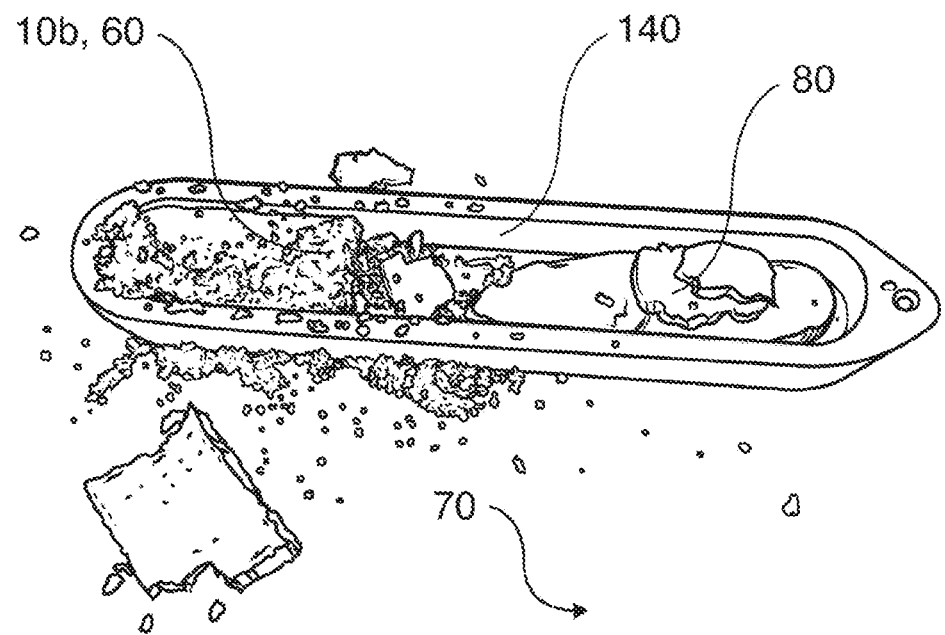
FIG. 7 is a perspective view that shows the composite after the method.

FIG. 7 shows the composite 60 after the method. The composite 60 was positioned as compactly as possible; this is necessary so that a specific portion can react with a liquid 70 consisting of deionized (fully desalinated) water and/or with the oxygen in the air during the quenching step at 960° C. Thus, a large part, preferably at least 60 percent by weight of the composite 60, passes exclusively through a quenching step and does not enter into any chemical reactions.

In addition to the quenching step, the method has a subsequent, especially manual, sorting step, in which at least one gram of the phase pure composite 60 is produced.

Figure 8:
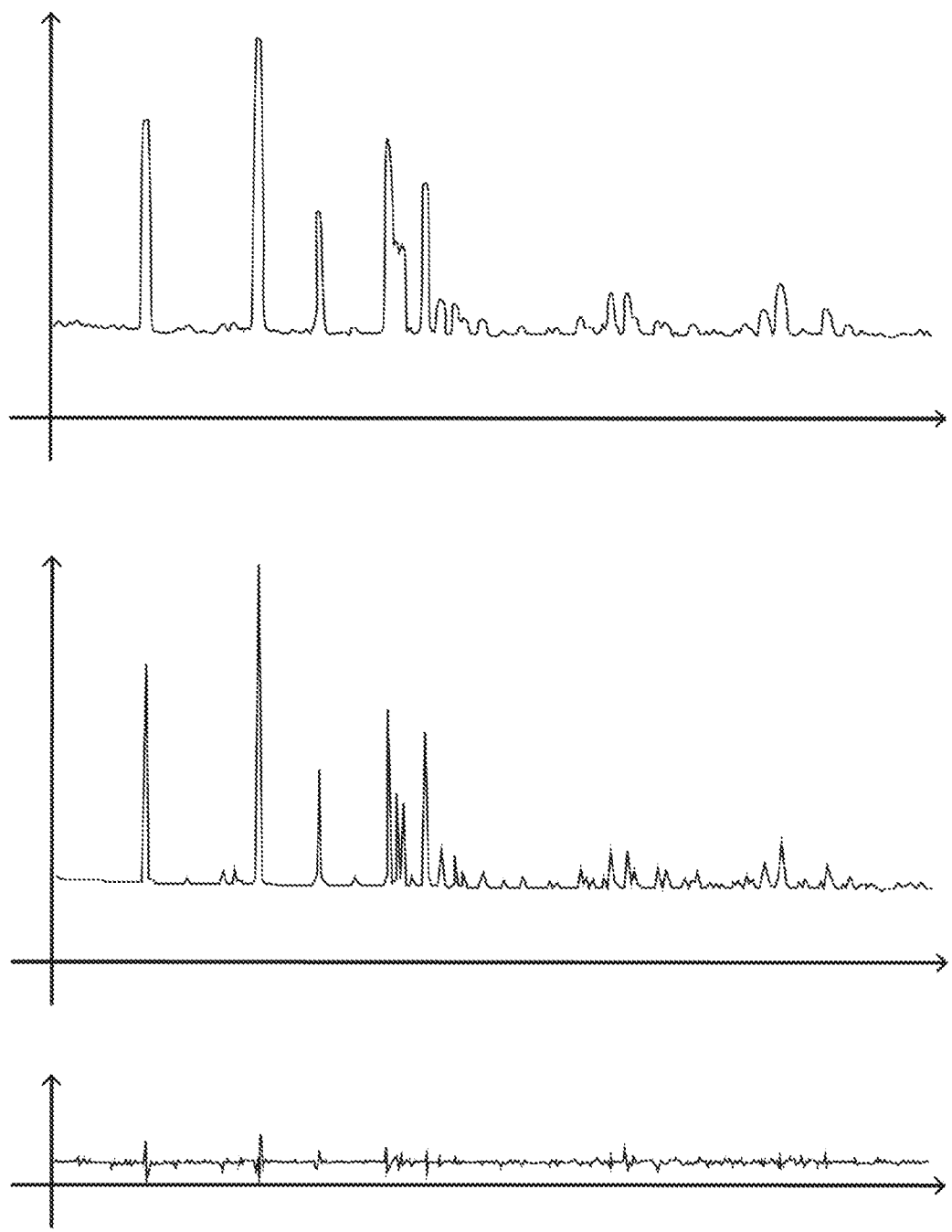
FIG. 8 is a graph that shows an XRD measurement of the composite.

In FIG. 8 is shown an XRD (x-ray diffraction) measurement of the composite 60 (upper plot; note: The central plot and the lower plot display the data better than the upper plot (unrealistic width of the peaks)). A composite which is phase pure and forms a Pmnb solid-state structure is used as basis for the simulation (central plot). The measurement of the composite 60 produced with the method according to the invention displays no foreign phases (lower plot) after the basis for simulation has been removed. The solid-state structure 10b, which is formed directly below a melting temperature of the composite 60, is produced.

Having described preferred embodiments of the composite and the method (which are intended to be illustrative and not limiting), it is noted that modifications and variations can be made by persons skilled in the art in light of the above teachings. It is therefore to be understood that changes may be made in the particular embodiments disclosed that are within the scope of the invention as outlined by the appended claims.

LIST OF REFERENCE NUMERALS

Solid-state structure 10
Area 20
Distance 30
Body side surface 40
Growth direction 50

Composite 60
Liquid 70
Product 80
Main axis reflex 90
Line 100
Foreign phase 110
Foreign phase 120
Crack 130
Ceramic ship 140

The invention claimed is:

1. A composite having a solid-state structure, silicate, lithium ions, and at least one paramagnetic or diamagnetic element, which is different from lithium, silicon, and oxygen and wherein the at least one paramagnetic or diamagnetic element is a transition metal ion, wherein
the transition metal ion is a subgroup element of the seventh subgroup,
the solid-state structure has two areas in which the solid-state structure forms an identical crystal orientation, and
the areas are arranged at a distance of at least one millimeter from each other.

2. The composite according to claim 1, wherein a partial amount of the lithium ions can be moved by means of external electromagnetic fields within the solid-state structure and into or out of the solid-state structure.

3. The composite according to claim 1, wherein the two areas are arranged directly on a same side surface of the composite.

4. The composite according to claim 1, wherein
the composite is produced by a production process having one process step in which the solid-state structure configures a growth direction, and
the areas are arranged at a distance of at least one millimeter perpendicular to the growth direction.

5. The composite according to claim 1 comprising a chemical composition defined by at least one molar ratio, wherein
the molar ratio is a quotient of an amount of substance of the at least one paramagnetic or diamagnetic element and an amount of substance of the silicate, and
the molar ratio is less than 0.4.

6. A composite having a solid-state structure, silicate, and lithium ions, wherein a partial amount of the lithium ions can be moved within the solid-state structure and into or out of the solid-state structure as a result of external electromagnetic fields, and with at least one paramagnetic or diamagnetic element that is different from lithium, silicon, and oxygen, wherein the silicate and the lithium ions form the solid-state structure at least in part, wherein
the solid-state structure has two areas in which the solid-state structure forms an identical crystal orientation, and
the areas are arranged at a distance of at least one millimeter from each other.

7. The composite according to claim 6, wherein
the solid-state structure is formed at least in part as a single crystal measuring no less than one cubic millimeter, and
the areas are arranged within the single crystal.

8. The composite according to claim 6, wherein the two areas are arranged directly on a same side surface of the composite.

9. The composite according to claim 6, wherein
the composite is produced by a production process having a process step in which the solid-state structure configures a growth direction, and
the areas are arranged at a distance of at least one millimeter perpendicular to the growth direction.

10. The composite according to claim 6 comprising a chemical composition defined by at least a molar ratio, wherein
the molar ratio is a quotient of an amount of substance of the at least one paramagnetic or diamagnetic element and an amount of substance of the silicate, and
the molar ratio is less than 0.4.

11. A method comprising:
quenching a composite to produce a solid-state structure of the composite, which differs from an ambient temperature solid-state structure, wherein
the composite has silicate, lithium ions, and an element that is different from lithium, silicon, and oxygen,
at least one gram of the phase pure composite is produced in the quenching, and
the solid-state structure, which is formed directly below a melting temperature of the composite, is produced.

12. The method according to claim 11 comprising a heating process that takes place under an oxygen-free atmosphere, wherein
a final temperature of the heating process is a starting temperature of the quenching, and
the solid-state structure is homogeneous after the heating process.

13. The method according to claim 11, wherein a Pmnb solid-state structure is formed in the quenching.

14. The method according to claim 11, wherein the quenching is carried out with the aid of a liquid.

15. The method according to claim 14, wherein the composite is cooled by the liquid which is in direct contact with the composite.

16. The method according to claim 11, wherein oxidation of the composite is reduced or prevented by means of an oxygen-absorbing product during the quenching.

17. The method according to claim 11, wherein the composite is cooled by at least ten Kelvin per second in the quenching.

18. The method according to claim 11, wherein a transition metal ion is used as element, wherein an element of the eighth subgroup is used as the transition metal ion.

19. The composite according to claim 1, wherein the transition metal ion is a manganese ion.

20. The composite according to claim 1, wherein
the solid-state structure is formed at least in part as a single crystal measuring no less than one cubic millimeter, and
the areas are arranged within the single crystal.

21. A method comprising:
quenching a composite to produce a solid-state structure of the composite, which differs from an ambient temperature solid-state structure, wherein
the composite has silicate, lithium ions, and an element that is different from lithium, silicon, and oxygen,
at least one gram of the phase pure composite is produced in the quenching,
the quenching is carried out with the aid of a liquid, and
the composite is cooled by the liquid which is in direct contact with the composite.

22. The method according to claim 21 comprising a heating process that takes place under an oxygen-free atmosphere, wherein
a final temperature of the heating process is a starting temperature of the quenching, and
the solid-state structure is homogeneous after the heating process.

23. The method according to claim 21, wherein the solid-state structure, which is formed directly below a melting temperature of the composite, is produced.

24. The method according to claim 21, wherein a Pmnb solid-state structure is formed in the quenching.

25. The method according to claim 21, wherein oxidation of the composite is reduced or prevented by means of an oxygen-absorbing product during the quenching.

26. The method according to claim 21, wherein the composite is cooled by at least ten Kelvin per second in the quenching.

27. The method according to claim 21, wherein a transition metal ion is used as element, wherein an element of the eighth subgroup is used as the transition metal ion.

28. A method comprising:
   quenching a composite to produce a solid-state structure of the composite, which differs from an ambient temperature solid-state structure, wherein
   the composite has silicate, lithium ions, and an element that is different from lithium, silicon, and oxygen,
   at least one gram of the phase pure composite is produced in the quenching, and
   oxidation of the composite is reduced or prevented by means of an oxygen-absorbing product during the quenching.

29. The method according to claim 28 comprising a heating process that takes place under an oxygen-free atmosphere, wherein
   a final temperature of the heating process is a starting temperature of the quenching, and
   the solid-state structure is homogeneous after the heating process.

30. The method according to claim 28, wherein the solid-state structure, which is formed directly below a melting temperature of the composite, is produced.

31. The method according to claim 28, wherein a Pmnb solid-state structure is formed in the quenching.

32. The method according to claim 28, wherein the quenching is carried out with the aid of a liquid.

33. The method according to claim 32, wherein the composite is cooled by the liquid which is in direct contact with the composite.

34. The method according to claim 28, wherein the composite is cooled by at least ten Kelvin per second in the quenching.

35. The method according to claim 28, wherein a transition metal ion is used as element, wherein an element of the eighth subgroup is used as the transition metal ion.

* * * * *

UNITED STATES PATENT AND TRADEMARK OFFICE
CERTIFICATE OF CORRECTION

Page 1 of 1

PATENT NO.       : 11,565,941 B2
APPLICATION NO.  : 16/951285
DATED            : January 31, 2023
INVENTOR(S)      : Hagen Schray It is certified that error appears in the above-identified patent and that said Letters Patent is hereby corrected as shown below:

On the Title Page

Change the published figure:

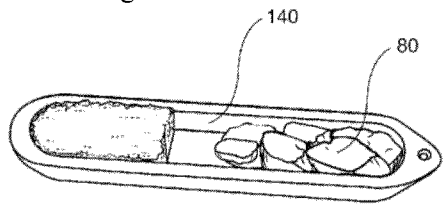

From Fig. 6:

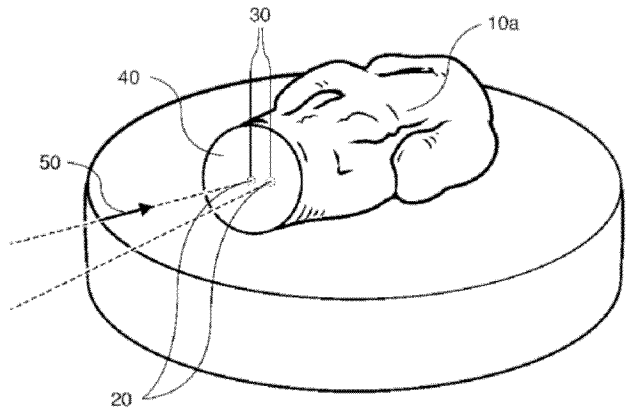

To Fig. 2:

Signed and Sealed this
Fifteenth Day of October, 2024

Katherine Kelly Vidal
*Director of the United States Patent and Trademark Office*